United States Patent
Kinoshita

(10) Patent No.: US 8,194,182 B2
(45) Date of Patent: Jun. 5, 2012

(54) SOLID-STATE IMAGE PICKUP APPARATUS WITH POSITIONING MARK INDICATING CENTRAL PART OF LIGHT-RECEIVING SECTION OF SOLID-STATE IMAGE SENSING DEVICE AND ELECTRONIC DEVICE COMPRISING THE SAME

(75) Inventor: Kazuo Kinoshita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 319 days.

(21) Appl. No.: 12/585,039

(22) Filed: Sep. 1, 2009

(65) Prior Publication Data

US 2010/0053394 A1 Mar. 4, 2010

(30) Foreign Application Priority Data

Sep. 2, 2008 (JP) ................. 2008-225081

(51) Int. Cl.
*H04N 5/225* (2006.01)
*H01L 27/00* (2006.01)

(52) U.S. Cl. .............. 348/374; 348/335; 250/208.1
(58) Field of Classification Search .......... 348/335, 348/373–376; 250/208.1
See application file for complete search history.

(56) References Cited

U.S. PATENT DOCUMENTS

| 6,122,009 A | 9/2000 | Ueda | |
| 7,782,391 B2 * | 8/2010 | Lin | 348/340 |
| 2003/0098912 A1 * | 5/2003 | Hosokai et al. | 348/207.99 |
| 2005/0219398 A1 | 10/2005 | Sato et al. | |
| 2006/0221225 A1 | 10/2006 | Tsukamoto et al. | |

FOREIGN PATENT DOCUMENTS

| JP | 61-19200 | 1/1986 |
| JP | 2003-229549 A | 8/2003 |
| JP | 2003-338964 | 11/2003 |
| JP | 2004-260250 A | 9/2004 |
| JP | 2005-286888 A | 10/2005 |
| JP | 2006-237051 A | 9/2006 |
| JP | 2006-279533 | 10/2006 |
| JP | 2008-153938 A | 7/2008 |

* cited by examiner

*Primary Examiner* — Timothy J Henn
(74) *Attorney, Agent, or Firm* — Edwards Wildman Palmer LLP; David G. Conlin; George N. Chaclas

(57) ABSTRACT

A solid-state image pickup apparatus 100 of the present invention includes a transparent cover section 24 which is provided so as to be spaced from a lens section, the transparent cover section 24 being provided (i) so as to face a light-receiving section of a solid-state image sensing device 22 and (ii) so as to have a gap between the solid-state image sensing device 22 and the transparent cover section 24. Furthermore, the transparent cover section 24 is provided with a positioning mark which serves as a reference for positioning the lens section in consideration of the solid-state image sensing device 22. Consequently, it is possible to provide a shock-resistant solid-state image pickup apparatus in which a lens section and an image pickup section are positionally aligned with high accuracy.

10 Claims, 9 Drawing Sheets

SOLID-STATE IMAGE PICKUP APPARATUS WITH POSITIONING MARK INDICATING CENTRAL PART OF LIGHT-RECEIVING SECTION OF SOLID-STATE IMAGE SENSING DEVICE AND ELECTRONIC DEVICE COMPRISING THE SAME

This Nonprovisional application claims priority under 35 U.S.C. §119(a) on Patent Application No. 2008-225081 filed in Japan on Sep. 2, 2008, the entire contents of which are hereby incorporated by reference.

TECHNICAL FIELD

The present invention relates to a solid-state image pickup apparatus in which a lens section and an image pickup section are positionally aligned with high accuracy, and to an electronic device including the solid-state image pickup apparatus.

BACKGROUND ART

A solid-state image pickup apparatus (camera module) which is applied to a camera of a mobile phone is normally arranged such that a solid-state image sensing device, a digital signal processing device (DSP), a lens, a lens holder, and a camera cone are integrated in a package. Mainly, conventional solid-state image pickup apparatuses are of single-focus type. On the other hand, a solid-state image pickup apparatus has been required, in recent years, to have higher pixel density, higher image quality, and higher function. For this reason, even a solid-state image pickup apparatus which is incorporated in a mobile phone is equivalent with a dedicated image pickup device, such as a digital still camera in terms of the number of pixels. Furthermore, such a solid-state image pickup apparatus is loaded with an optical system for realizing a zooming function or an automatic focusing function.

On the other hand, in order to cause a solid-state image pickup apparatus to function as designed, it is necessary to cause an optical center of a solid-state image sensing device to coincide with an optical center of optical components, including a lens. The optical center of the solid-state image sensing device is a design center of a pixel plane which is formed by a plurality of pixels provided on the solid-state image sensing device, that is, a pixel center. On the other hand, the optical center of the optical components is a center of the lens, that is, an optical axis. When the pixel center and the center of the lens (optical axis) do not coincide with each other, there occurs a problem that four corners of a picked-up image blur or darken due to the design of the solid-state image sensing device.

Accordingly, in order to cause a solid-state image pickup apparatus to have higher pixel density, higher image quality, and higher function, it is essential (i) that the pixel center and the optical axis be collinearly provided and (ii) that a light receiving plane (light receiving surface) of the solid-state image sensing device and the optical axis intersect at right angles.

In an early stage where a solid-state image pickup apparatus became incorporated in a portable device or a mobile phone, the solid-state image pickup apparatus was extremely simply and easily arranged from the viewpoint of miniaturization and weight reduction. On the contrary, a recent solid-state image pickup apparatus has been arranged such that a precise and highly accurate system is applied and a light receiving section of the solid-state image sensing device becomes finer in accordance with a development in the process of producing an IC. Against this backdrop, a higher accuracy is required in positionally aligning the pixel center and the center of the lens when a solid-state image pickup apparatus is assembled.

On the other hand, a portable device or a mobile phone in which a solid-state image pickup apparatus is incorporated is required to be miniaturized (downsized), lighter, and power-saved. This makes it impossible to apply, to a solid-state image pickup apparatus which is incorporated in a portable device or a mobile phone, a complicated correction system which is employed for a general dedicated image pickup device so as to correct positioning of the pixel center and the center of the lens.

Conventionally, positioning of optical components at the time of assembly of a solid-state image pickup apparatus has been carried out with reference to a wiring substrate on which the solid-state image sensing device is mounted. Specifically, the positioning is carried out in such a manner that: the light receiving surface of the solid-state image sensing device is regarded as identical or parallel to a mounted surface of the wiring substrate on which mounted surface the solid-state image sensing device is mounted; and optical components, such as a lens and a lens holder are positioned with reference to the mounted surface so as to be mounted on the wiring substrate.

For such positional alignment of optical components, it is possible to use a device for mounting a component on a wiring substrate (soldering device). This brings about an advantage that it is possible to reduce capital investment to the minimum and to employ know-how as well. However, as a recent solid-state image pickup apparatus becomes more accurate, revealed are: (i) variations in production of a wiring substrate, (ii) variations in sizes of components to be loaded in a solid-state image pickup apparatus other than the optical components, or (iii) variations in an accuracy in assembly or mounting of the components.

It is possible to carry out focus (focal length) adjustment by devising various methods after a solid-state image pickup apparatus is assembled. However, an uneven blur in an image (a state in which an image is unevenly focused between top and bottom or between left and right) or a state in which four corners of an image darken is due to the positioning of optical components at the time of assembly of a solid-state image pickup apparatus. This makes it impossible to correct the focus by fine adjustment after the solid-state image pickup apparatus has been assembled. Accordingly, it is extremely important how accurately optical components are positioned when a solid-image pickup apparatus is assembled.

Therefore, Patent Literatures 1 through 3, for example, disclose respective methods for positioning such optical components.

FIG. 11 is a schematic view illustrating the positioning method described in Patent Literature 1. Patent Literature 1 discloses a surface mounting technology in which a component is mounted on a printed circuit board. In Patent Literature 1, a specific positioning mark (alignment mark) is provided on a printed circuit board so as to mount a component on the printed circuit board. A component is loaded in a desired position according to calculation by use of this positioning mark and design information.

Specifically, a pattern or hole 202 which has a specific shape and is provided on a printed circuit board is recognized as a reference position (see FIG. 11). A mounted position (P) on which a component 203 is mounted is predetermined, and it is thus possible to calculate a positional relationship between the reference position and the component 203 by use of design information (e.g., a size, coordinate information or the like of CAD data). For this reason, in a case where the component 203 is provided in a position ($P_O$) on the printed circuit board which position is shifted from the mounted position, the position of the component 203 is corrected so as to have the positional relationship between the reference position and the component 203 which positional relationship is calculated by use of the design information. This allows the component 203 to be provided and mounted in a given position on the printed circuit board.

FIG. 12 is a cross-sectional view illustrating a solid-state image pickup apparatus described in Patent Literature 2. A solid-state image pickup apparatus 300 is arranged such that notches which are formed in a leg portion 303 of a lens section 302 fit to four corners of a solid-state image sensing device 301. This allows the leg portions 303 to be directly brought into contact with a light receiving surface of the solid-state image sensing device 301, so that the lens section 302 is positioned.

FIG. 13 is a cross-sectional view illustrating a solid-state image pickup apparatus described in Patent Literature 3. A solid-state image pickup apparatus 400 is arranged such that a bottom of a lens holder 404 is brought into contact with a transparent cover section 402 which is adhered to a solid-state image sensing device 401 and which is exposed in a sealing section 403 (see FIG. 13). This allows a lens 405 to be positioned in consideration of the solid-state image sensing device 401.

However, a conventional solid-state image pickup apparatus has problems of: (i) positioning of optical components with low accuracy and (ii) vulnerability to an external shock.

Specifically, application of the method described in Patent Literature 1 for soldering a component onto a printed circuit board to production of a solid-state image pickup apparatus causes a reference for positioning optical components to be provided on a printed circuit board. Namely, the reference point on the printed circuit board indirectly positions the pixel center of the solid-state image sensing device and the optical axes of the optical components. However, according to this method, (i) variations in production of a printed circuit board, (ii) variations in sizes of components provided on the printed circuit board other than the optical components, (iii) variations in an accuracy in mounting (assembly) of the components on the printed circuit board, or (iv) the like are adversely added to an accuracy in positioning of the optical components. This produces an error in the positioning of the optical components, and it is thus impossible to position the optical components with high accuracy.

Furthermore, it is also possible to provide the reference for positioning the optical components on the solid-image sensing device (an LSI) when the method of Patent Literature 1 is applied to the production of a solid-state image pickup apparatus. However, it is virtually impossible to provide a positioning reference, such as a size, a color, or a contrast which can be recognized by an apparatus (actually a camera capable of taking a close-up) for recognizing the reference for positioning the optical components.

Moreover, the solid-state image pickup apparatus 300 of Patent Literature 2 is arranged such that the leg portion 303 of the lens section 302 is directly brought into contact with the solid-state image sensing device 301, so that optical components are positioned (see FIG. 12). For this reason, when this solid-state image pickup apparatus 300 is incorporated in a portable device, a shock due to falling or the like is transmitted directly to the solid-state image sensing device. This causes displacement of the solid-state image sensing device 301.

Further, a short-circuit which occurs between a power source and an earth (a ground) due to a crack made in the solid-state image sensing device 301 by a shock may generate heat in a device (battery section).

Furthermore, the solid-state image pickup apparatus 400 of Patent Literature 3 is arranged such that the bottom of the lens holder 404 is brought into contact with the transparent cover section 402. This causes a shock to the solid-state image pickup apparatus 400 to be transmitted to the solid-state image sensing device 401 through the transparent cover section 402. As a result, displacement or breakage of the solid-state image sensing device 401 may occur similarly to the case of the solid-state image pickup apparatus 300 of Patent Literature 2. Moreover, the transparent cover section 402, which is normally made of a glass substrate, is weaker in mechanical strength or more vulnerable than a wiring substrate on which the solid-state image sensing device 401 is provided. For this reason, when a shock is applied directly to the transparent cover section 402, the transparent cover section 402 is easy to break and the solid-state image pickup apparatus 400 is easy to malfunction.

Moreover, the solid-state image pickup apparatus 400 of Patent Literature 3 is arranged such that: a bottom surface of the lens holder 404 is brought into contact with a top surface of the transparent cover section 402 and a positioning claw 408 abuts on a peripheral side section of the transparent cover section 402; and a claw section 407 formed in the sealing section 403 is fit to a supporting section 406. This fixes a relative position of the transparent cover section 402 and the lens holder 404.

The solid-state image pickup apparatus 400 is actually arranged such that a part in which the positioning claw 408 abuts on the transparent cover section 402 and a part in which the claw section 407 is fit to the supporting section 406 are provided to have some space (play). However, a solid-state image pickup apparatus is required to be miniaturized (downsized) as described earlier, and it is thus impossible to allow even room for formation of such space (play). Furthermore, only when there is room in design, it is possible to form a member, such as the claw section 407 which is formed in the sealing section 403. However, neither the claw section 407 nor the part to which the claw section is fit is not what fulfills a primary function of the solid-state image pickup apparatus 400. As described earlier, the arrangement in which the optical components are positioned in the solid-state image pickup apparatus 400 of Patent Literature 3 is contrary to a requirement for miniaturization (downsizing). Accordingly, such an arrangement should be excluded as much as possible, and miniaturization should be promoted, instead.

Citation List

Patent Literature 1

Japanese Patent Application Publication, Tokukaisho, No. 61-19200 A (Publication Date: Jan. 28, 1986)

Patent Literature 2

Japanese Patent Application Publication, Tokukai, No. 2003-338964 A (Publication Date: Nov. 28, 2003)

Patent Literature 3

Japanese Patent Application Publication, Tokukai, No. 2006-279533 A (Publication Date: Oct. 12, 2006)

SUMMARY OF INVENTION

The present invention has been made in view of the conventional problems, and its object is to provide a shock-resistant solid-state image pickup apparatus in which a lens section and an image pickup section are positionally aligned with high accuracy.

In order to attain the object, a solid-state image pickup apparatus of the present invention includes: a lens section which forms a subject image; and an image pickup section which converts the subject image formed by the lens section, into an electric signal, the image pickup section including: a wiring substrate; a solid-state image sensing device which is mounted on the wiring substrate; and a transparent cover section which is provided (i) so as to face a light-receiving section of the solid-state image sensing device and (ii) so as to have a gap between the solid-state image sensing device and the transparent cover section, the solid-state image sensing device and the transparent cover section, each being provided so as to be spaced from the lens section, and the transparent cover section being provided with a positioning mark which serves as a reference for positioning the lens section in consideration of the image pickup section.

The invention is arranged such that the positioning mark is provided on the transparent cover section. This positioning mark serves as a reference position for positioning the image pickup section (solid-state image sensing device) and the lens section. It is possible to position the lens section and the image pickup section with higher accuracy in such a case where the transparent cover section is caused to serve as a reference for positioning the image pickup section and the lens section than in a case where the wiring substrate is caused to serve as the reference for positioning the image pickup section and the lens section.

Furthermore, the invention is arranged such that the solid-state image sensing device and the transparent cover section are provided so as to be spaced from the lens section. Namely, the solid-state image sensing device and the transparent cover section are not in contact with the lens section. This prevents a shock which may be applied to the lens section from being transmitted directly to the solid-state image sensing device, and it is thus possible to prevent displacement of the solid-state image sensing device. This makes it possible to keep a state in which the lens section and the image pickup section are positionally aligned with high accuracy. Moreover, the shock is not transmitted to the solid-state image sensing device through the transparent cover section, either. This allows protection of the transparent cover section and the solid-state image sensing device against a shock.

As described earlier, according to the present invention, it is possible to provide a shock-resistant solid-state image pickup apparatus in which a lens section and an image pickup section are positionally aligned with high accuracy.

For a fuller understanding of the nature and advantages of the invention, reference should be made to the ensuing detailed description taken in conjunction with the accompanying drawings.

DESCRIPTION OF EMBODIMENTS

Figure 2:
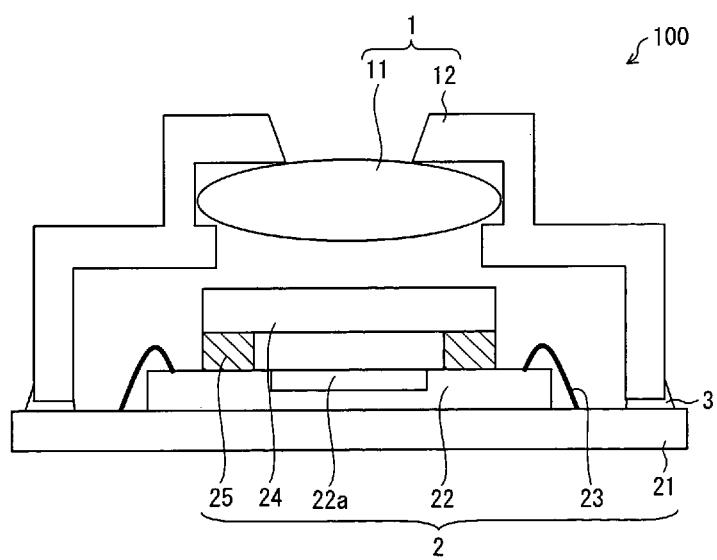
FIG. 2 is a cross-sectional view illustrating the solid-state image pickup apparatus of the present invention.

An embodiment of the present invention is described below with reference to the attached drawings. FIG. 2 is a cross-sectional view illustrating a solid-state image pickup apparatus of the present embodiment.

A solid-state image pickup apparatus 100 is arranged such that an adhering section 3 adheres a lens section 1 to an image pickup section 2 (see FIG. 2). Note that for simple explanation, the lens section 1 side and the image pickup section 2 side are designated as an upper side and a lower side, respectively.

The lens section 1 directs external light toward the image pickup section 2. The lens section 1 is arranged such that a hollow lens barrel 12 holds a lens 11 for image pickup inside (see FIG. 2).

The image pickup section 2 converts a subject image formed by the lens section 1 into an electric signal. Namely, the image pickup section 2 photoelectrically converts light received from the lens section 1. The image pickup section 2 is constituted by a wiring substrate 21, a solid-state image sensing device 22, a wiring 23, a transparent cover section 24, and an adhering section 25. The solid-state image sensing device 22 is mounted on the wiring substrate 21. The wiring 23 electrically connects the wiring substrate 21 to the solid-state image sensing device 22.

The wiring substrate 21 is a substrate to pick up an electric signal of the solid-state image sensing device 22. The wiring substrate 21 includes a patterned wiring (not illustrated) thereon so as to electrically connect the wiring substrate 21 to the solid-state image sensing device 22. The wiring substrate 21 may be, for example, a printed circuit board or a ceramic board.

The solid-state image sensing device 22 converts a subject image formed by the lens section 1 into an electric signal. The solid-state image sensing device 22 is mounted on a front side surface of the wiring substrate 21. Furthermore, the solid-state image sensing device 22 is held inside the lens section 1. Moreover, the solid-state image sensing device 22 is arranged such that a semiconductor board where a semiconductor circuit is provided (e.g. silicon single crystal board) is formed rectangularly in plan view. The solid-state image sensing device 22 may be, for example, a CCD (charge-coupled device) image sensor, a CMOS (complementary metal-oxide semiconductor) image sensor, or a VMIS image sensor (Threshold Voltage Modulation Image Sensor).

The solid-state sensing device 22 has a surface (top) on which a light-receiving section 22a, where a plurality of pixels are arranged in a matrix pattern, is provided. The light-receiving section 22a is an area (a light imaged area) in which light received from the lens section 1 is imaged, and the light-receiving section 22a can be referred to as a pixel area. The image pickup section 2 has an image pickup surface, and actually, the image pickup surface is the light-receiving section 22a.

The solid-state image sensing device 22 converts a subject image formed on the light-receiving section 22a into an electric signal, and supplies the electric signal as an analogue image signal. Namely, the photoelectric conversion is carried out by the light-receiving section 22a. A DSP (not illustrated) controls the solid-state image sensing device 22, and processes an image signal generated by the solid-state image sensing device 22.

The adhering section 25 adheres the transparent cover section 24 to the solid-state image sensing device 22. The transparent cover section 24 is provided (i) so as to face the light-receiving section 22a of the solid-state image sensing device 22 and (ii) so as to have a gap between the solid-state image sensing device 22 and the transparent cover section 24. Namely, the transparent cover section 24, which is provided so as to be spaced from the light-receiving section 22a of the solid-state image sensing device 22, covers at least the light-receiving section 22a of the solid-state image sensing device 22. This allows prevention of penetration and attachment of dust to the light-receiving section 22a. Further, the transparent cover section 24 is provided so as to be spaced from the lens section 1. Note that a surface of the transparent cover section 24 which surface faces the solid-state image sensing device 22 is larger in area than the light-receiving section 22a of the solid-state image sensing device 22.

The transparent cover section 24 is made of transparent glass, a transparent resin, or the like. The transparent cover section 24 (a surface of the transparent cover section 24 which surface faces the lens section 1) may be coated with an optical filter, such as an infrared cut filter. This allows the transparent cover section 24 to further have a function of cutting infrared rays.

The adhering section 25 adheres the transparent cover section 24 to the solid-state image sensing device 22. The adhering section 25 is provided around the light-receiving section 22a of the solid-state image sensing device 22. This causes the adhering section 25 to adhere the transparent cover section 24 to the solid-state image sensing device 22. Namely, the transparent cover section 24 covers the light-receiving section 22a of the solid-state image sensing device 22.

More specifically, the adhering section 25 is provided around the light-receiving section 22a of the solid-state image sensing device 22. The adhering section 25 is provided with a ventilation hole (not illustrated). This allows (i) prevention of penetration of humidity into a space secured between the solid-state image sensing device 22 and the transparent cover section 24 and (ii) prevention of penetration and attachment of dust to the light-receiving section 22a.

The adhering section 25 is, for example, realized (i) by adhering a sheet adhesive on the solid-state image sensing device 22, and thereafter (ii) by carrying out patterning process in which processes, such as exposure and development, are carried out by use of photolithography technique. The photolithography technique allows the patterning of the adhering section 25 to be carried out with high accuracy. Furthermore, the sheet adhesive allows the adhering section 25 to have a uniform thickness. This allows the transparent cover section 24 to be adhered, with high accuracy, to the light-receiving section 22a of the solid-state image sensing device 22.

In the solid-state image pickup apparatus 100 arranged as described earlier, the solid-state image sensing device 22 receives external light from the lens section 1 through the transparent cover section 24. The received light is directed toward the light-receiving section 22a of the solid-state image sensing device 22, and a subject image is formed on the light-receiving section 22a. The solid-state image sensing device 22 electrically converts the subject image into an electric signal. The image pickup section 2 carries out various processes (e.g., image processing, and the like) with respect to the converted electric signal.

Figure 3:
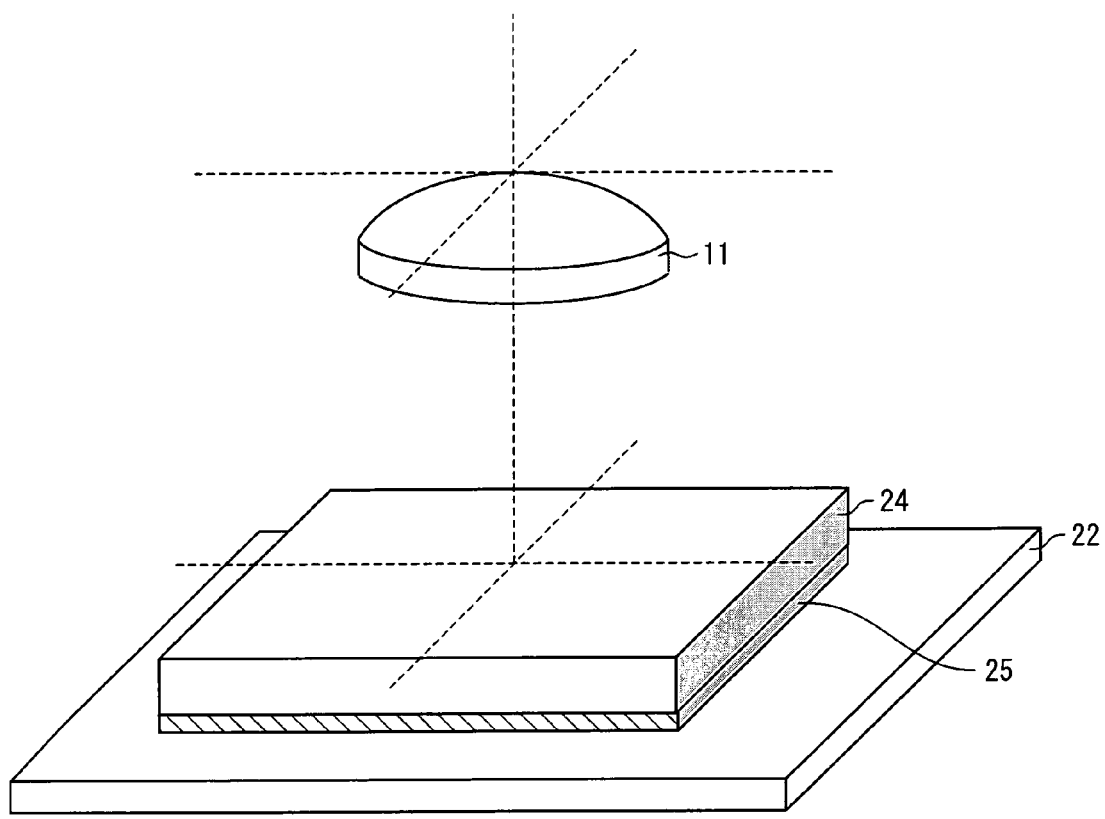
FIG. 3 is a perspective view illustrating how a lens and a solid-state image sensing device are positioned in the solid-state image pickup apparatus of the present invention.

Note here that in order to realize higher pixel density, higher image quality, and higher function, it is essential to arrange the solid-state image pickup apparatus 100 such that a center (pixel center) of the light-receiving section 22a of the solid-state image sensing device 22 coincides with a center (an optical axis) of the lens 11 and the light-receiving section 22a and the optical axis intersect at right angles. FIG. 3 illustrates an ideal arrangement in which the solid-state image sensing device 22 and the lens 11 meet such requirements. Namely, FIG. 3 is a perspective view illustrating how the lens 11 and the solid-state image sensing device 22 are positioned in the solid-state image pickup apparatus 100.

FIG. 3 illustrates the center (pixel center) of the light-receiving section 22a on the transparent cover section 24 since the transparent cover section 24 covers the light-receiving section 22a as described earlier. The pixel center is an intersecting point of two broken lines which are illustrated on the transparent cover section 24. On the other hand, the center of the lens 11 is an intersecting point of two broken lines which are parallel to the respective two broken lines on the transparent cover section 24. Further, the optical axis is a broken line which extends from the center of the lens 11 toward the solid-state image sensing device 22 so as to be perpendicular to the two broken lines which are parallel to the respective two broken lines on the transparent cover section 24. FIG. 3 illustrates the center of the light-receiving section 22a and the center of the lens 11 which are provided on the optical axis. Further, the optical axis is perpendicular to the solid-state image sensing device 22 (the light-receiving section 22a). When the lens 11 and the solid-state image sensing device 22 are thus provided, a problem that four corners of a picked-up image blur or darken does not occur.

As described earlier, it is particularly important in the solid-state image pickup apparatus 100 how to position the lens section 1 (lens 11) and the image pickup section 2 (solid-image sensing device 22).

Figure 1:
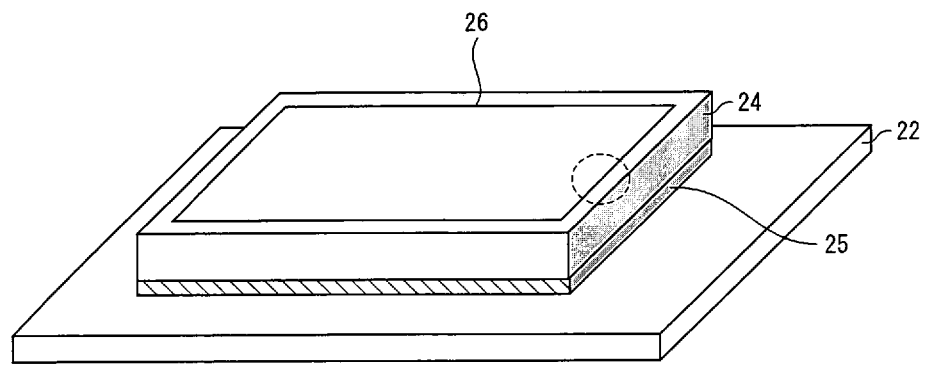
FIG. 1 is a perspective view illustrating a positioning mark provided in a transparent cover section in a solid-state image pickup apparatus of the present invention.

Therefore, the solid-state image pickup apparatus 100 is arranged such that the transparent cover section 24 is provided with a positioning mark which serves as a reference for positioning the lens section 1 in consideration of the image pickup section 2. FIG. 1 is a perspective view illustrating a positioning mark 26 which is provided in the transparent cover section 24 in the solid-state image pickup apparatus 100.

As described later, the positioning mark 26 serves as a reference for positioning the lens 11 in consideration of the solid-state image sensing device 22. Namely, the positioning mark 26 serves as a reference position for positioning the lens section 1 and the image pickup section 2. FIG. 1 illustrates the positioning mark 26 provided in a rim of the transparent cover section 24. Namely, the vicinity of the periphery of the transparent cover section 24 serves as a reference position for positioning the lens 11 in consideration of the solid-state image sensing device 22. The rim of the transparent cover section 24 is provided in an outer edge of the light-receiving section 22a of the solid-state image sensing device 22. Namely, the positioning mark 26 is provided in an area in which the positioning mark 26 hardly affects image-pickup. This allows positioning of the lens section 1 and the image pickup section 2 without causing the positioning mark 26 to affect image pickup.

Figure 4:
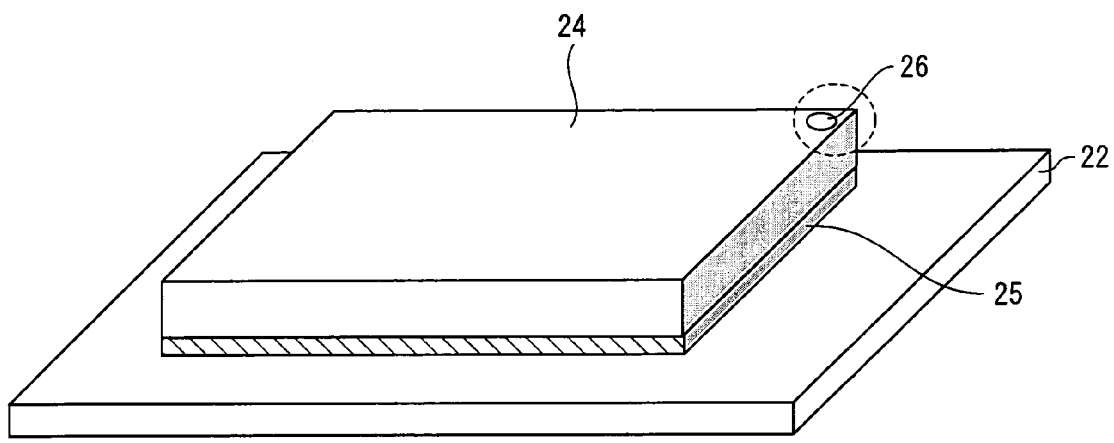
FIG. 4 is a perspective view illustrating another positioning mark provided in the transparent cover section in the solid-state image pickup apparatus of the present invention.

The positioning mark 26 is not particularly limited provided that it is formed on the transparent cover section 24. FIG. 4 is, for example, a perspective view illustrating another positioning mark 26 provided in the transparent cover section 24. FIG. 4 illustrates the positioning mark 26 provided in a corner portion of the transparent cover section 24. Specifically, FIG. 4 illustrates the positioning mark 26 provided in a corner of four corners of the transparent cover section 24 of a rectangular shape. Namely, a corner of the four corners of the transparent cover section 24 serves as the reference position for positioning the lens 11 in consideration of the solid-state image sensing device 22. This facilitates recognition of the positioning mark 26, and it is thus possible to simply and easily position the lens section 1 and the image pickup section 2.

Figure 5:
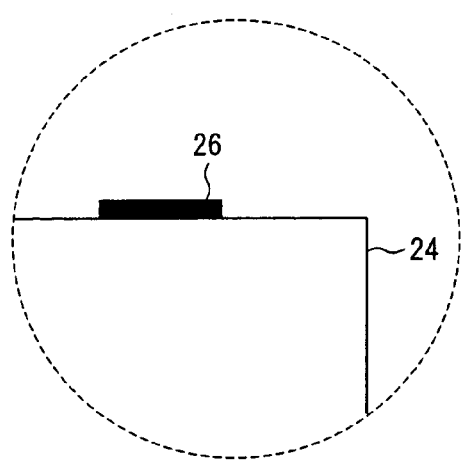
FIG. 5 is a cross sectional view illustrating the positioning mark in the solid-state image pickup apparatus of the present invention.
Figure 6:
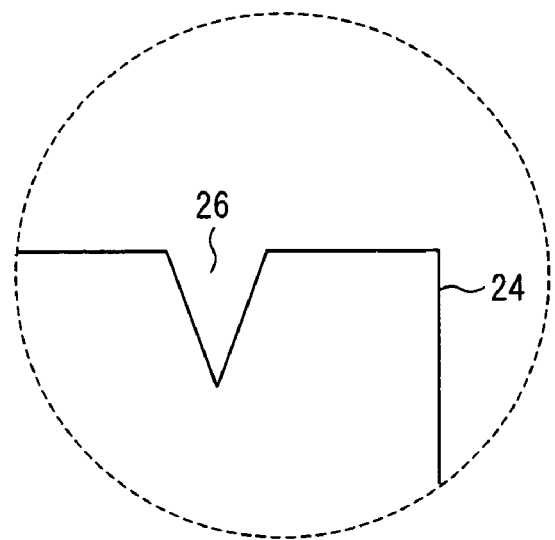
FIG. 6 is a cross sectional view illustrating the positioning mark in the solid-state image pickup apparatus of the present invention.
Figure 7:
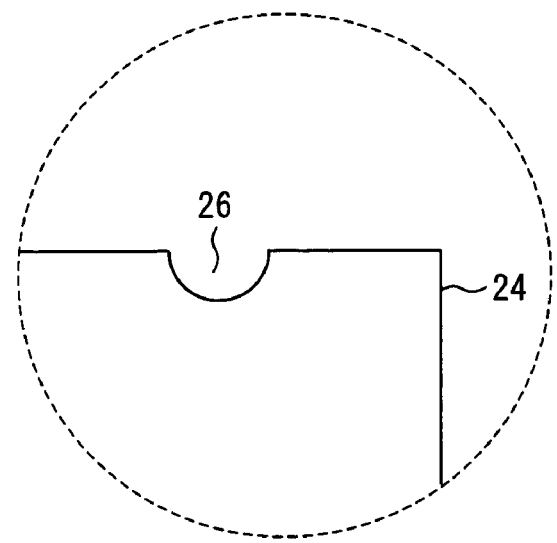
FIG. 7 is a cross sectional view illustrating the positioning mark in the solid-state image pickup apparatus of the present invention.

FIGS. 5 through 7 are cross-sectional views and show specific examples of the positioning mark 26 illustrated in broken line parts of FIGS. 1 and 4.

The positioning mark 26 may be a reflecting film (see FIG. 5) or a groove formed in the transparent cover section 24 (see FIGS. 6 and 7).

It is possible to form such a reflecting film as illustrated in FIG. 5 by a metallized film, metal plating film, metal foil, or the like. Furthermore, it is possible to provide the reflecting film anywhere by printing. For example, in a case where the positioning mark 26 is provided in the vicinity of the periphery of the transparent cover section 24 (see FIG. 1), it is possible to form the reflecting film by transferring a shape of a frame of the positioning mark 26. On the other hand, in a case where the positioning mark 26 is provided in the vicinity of a corner of the transparent cover section 24 (see FIG. 4), it is possible to form the reflecting film by transferring a shape of the positioning mark 26.

In a case where the positioning mark 26 is a reflecting film as described earlier, the reflecting film reflects light which is directed, toward the transparent cover section 24, from a light source (illumination) of an apparatus for producing the solid-state image pickup apparatus 100 (an on-board apparatus). This facilitates recognition of the reflecting film. This allows use of a reflecting film as a recognition mark (alignment mark), and it is thus possible to easily position the lens section 1 and the image pickup section 2.

On the other hand, it is possible to form such grooves as illustrated in FIGS. 6 and 7 by marking, dicing saw, etching, or the like. A cross section of a groove is not particularly limited in shape. The cross section may be V-shaped (see FIG. 6) or semicircular (see FIG. 7).

In a case where the positioning mark 26 is a groove provided in the transparent cover section 24 as described earlier, how light which is directed, toward the transparent cover section 24, from the light source (illumination) of the apparatus for producing the solid-state image pickup apparatus 100 (on-board apparatus) is reflected is different between in a part in which the groove is formed and in a plane part in which the groove is not formed. This facilitates recognition of the groove. This allows use of a groove as the recognition mark (alignment mark), and it is thus possible to easily position the lens section 1 and the image pickup section 2.

In a case where the positioning mark 26 is a reflecting film or a groove, it is preferable that the positioning mark 26 be provided so as not to overlap the light-receiving section 22a. Furthermore, the solid-state image pickup apparatus 100 is arranged such that the adhering section 25 which is provided around the light-receiving section 22a adheres the transparent cover section 24 to the solid-state image sensing device 22. For this reason, it is preferable that the positioning mark 26 be provided right above the adhering section 25. This allows positioning of the lens section 1 and the image pickup section 2 without causing the positioning mark 26 to affect a picked-up image.

Figure 8:
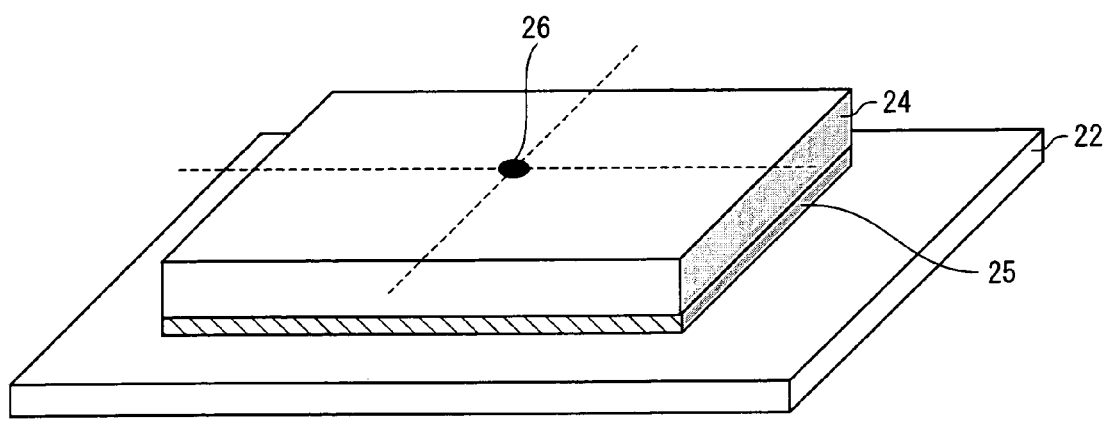
FIG. 8 is a perspective view illustrating the positioning mark in the solid-state image pickup apparatus of the present invention.

Other than a reflecting film and a groove which are described earlier, the positioning mark 26 may be a light-emitting film which is transparent to light received during image pickup and which emits light only under irradiation of given light which does not affect image pickup. The light-emitting film may be, for example, a light-emitting film which is transparent under external light and which emits light under black light irradiation. FIG. 8 is a perspective view illustrating another positioning mark 26 which is provided in the transparent cover section 24. Such a light-emitting film is made from ink which is transparent and colorless under normal light and which develops color under irradiation of black light (ultraviolet of 365 nm or more). Such ink may be, for example, Seibundo LT-P ink. When such a light-emitting film is applied as the positioning mark 26, the positioning mark is not recognized under normal light (light received during image pickup) and the positioning mark 26 emerges only under black light irradiation. For this reason, it is possible to provide the positioning mark 26 in a central part of the light-receiving section 22a of the solid-state image sensing device 22. This allows a position of the center of the light-receiving section 22a (a pixel array) to be indicated on the transparent cover section 24 only under black light irradiation. This allows positioning of the lens section 1 and the image pickup section 2 with higher accuracy.

Figure 9:
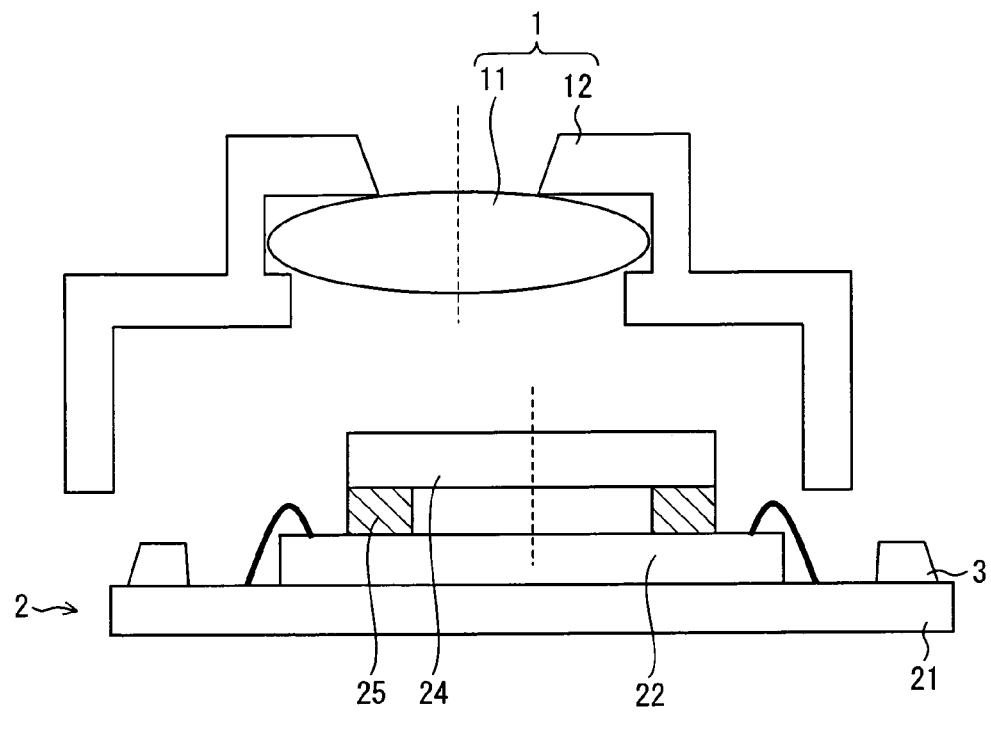
FIG. 9 is a cross-sectional view illustrating an example of how a lens section and an image pickup section are positioned in the solid-state image pickup apparatus of the present invention.
Figure 9:
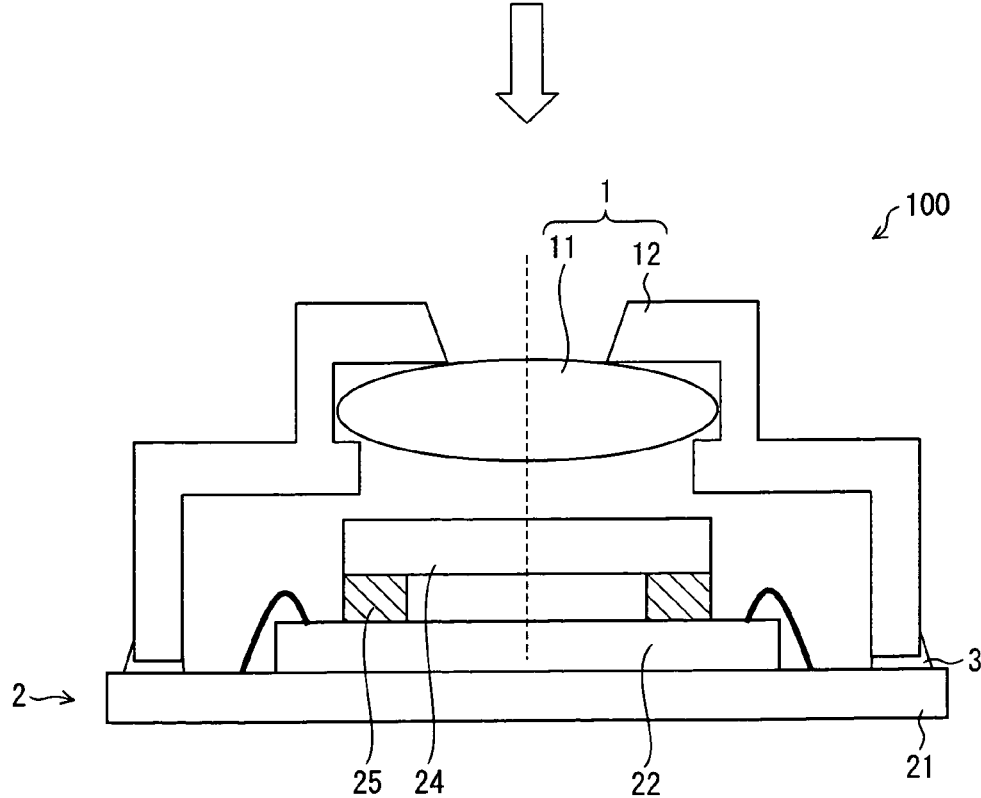

FIG. 9 is a cross-sectional view illustrating a step of producing the solid-state image pickup apparatus 100. The solid-state image pickup apparatus 100 is produced such that the adhering section 3 adheres the lens section 1 to the image pickup section 2. In this case, the pixel center of the solid-state image sensing device 22 is caused to coincide with the center of the lens 11 by causing the positioning mark 26 to serve as the reference position for positioning the lens section 1 and the image pickup section 2. This allows positioning of the lens section 1 and the image pickup section 2 with high accuracy.

As described earlier, the solid-state image pickup apparatus 100 includes the transparent cover section 24 on which the positioning mark 26 is provided. This positioning mark 26 is the reference position for positioning the image pickup section 2 (solid-state image sensing device 22) and the lens section 1. In such a case where the transparent cover section 24 is caused to serve as the reference for positioning the lens section 1 and the image pickup section 2, an accuracy in positioning of the transparent cover section 24 on the solid-state image sensing device 22 is ±0.05 mm (±50 μm). On the other hand, in a case where the wiring substrate 21 is caused to serve as the reference for positioning the lens section 1 and the image pickup section 2, an accuracy in the positioning of the transparent cover section 24 on the solid-state image sensing device 22 is ±0.15 mm (±150 μm). Accordingly, causing the transparent cover section 24 to serve as the reference for positioning the lens section 1 and the image pickup section 2 allows positioning of the lens section 1 and the image pickup section 2 with higher accuracy than conventionally causing the wiring substrate 21 to serve as the reference for positioning the lens section 1 and the image pickup section 2.

Furthermore, the solid-state image pickup apparatus 100 is arranged such that the solid-state image sensing device 22 and the transparent cover section 24 are provided so as to be spaced from the lens section 1. Namely, the solid-state image sensing device 22 and the transparent cover section 24 are not in contact with the lens section 1. This prevents a shock which may be applied to the lens section 1 from being transmitted directly to the solid-state image sensing device 22, and it is thus possible to prevent displacement of the solid-state image sensing device 22. This makes it possible to keep a state in which the lens section 1 and the image pickup section 2 are positionally aligned with high accuracy. Moreover, the shock is not transmitted to the solid-state image sensing device 22 through the transparent cover section 24, either. This allows protection of the transparent cover section 24 and the solid-state image sensing device 22 against a shock.

Note that a point of difference between the solid-state image pickup apparatus 100 of the present embodiment and a conventional solid-state image pickup apparatus is where the reference for positioning the image pickup section and the lens section is provided. The solid-state image pickup apparatus 100 may be arranged such that the pixel center of the solid-state image sensing device 22 and the center of the lens 11 are positioned in a conventional manner except the point of difference, for example by employing the method disclosed in Patent Literature 1.

Accordingly, it is possible to provide a shock-resistant solid-state image pickup apparatus 100 in which the lens section 1 and the image pickup section 2 are positionally aligned with high accuracy.

Figure 10:
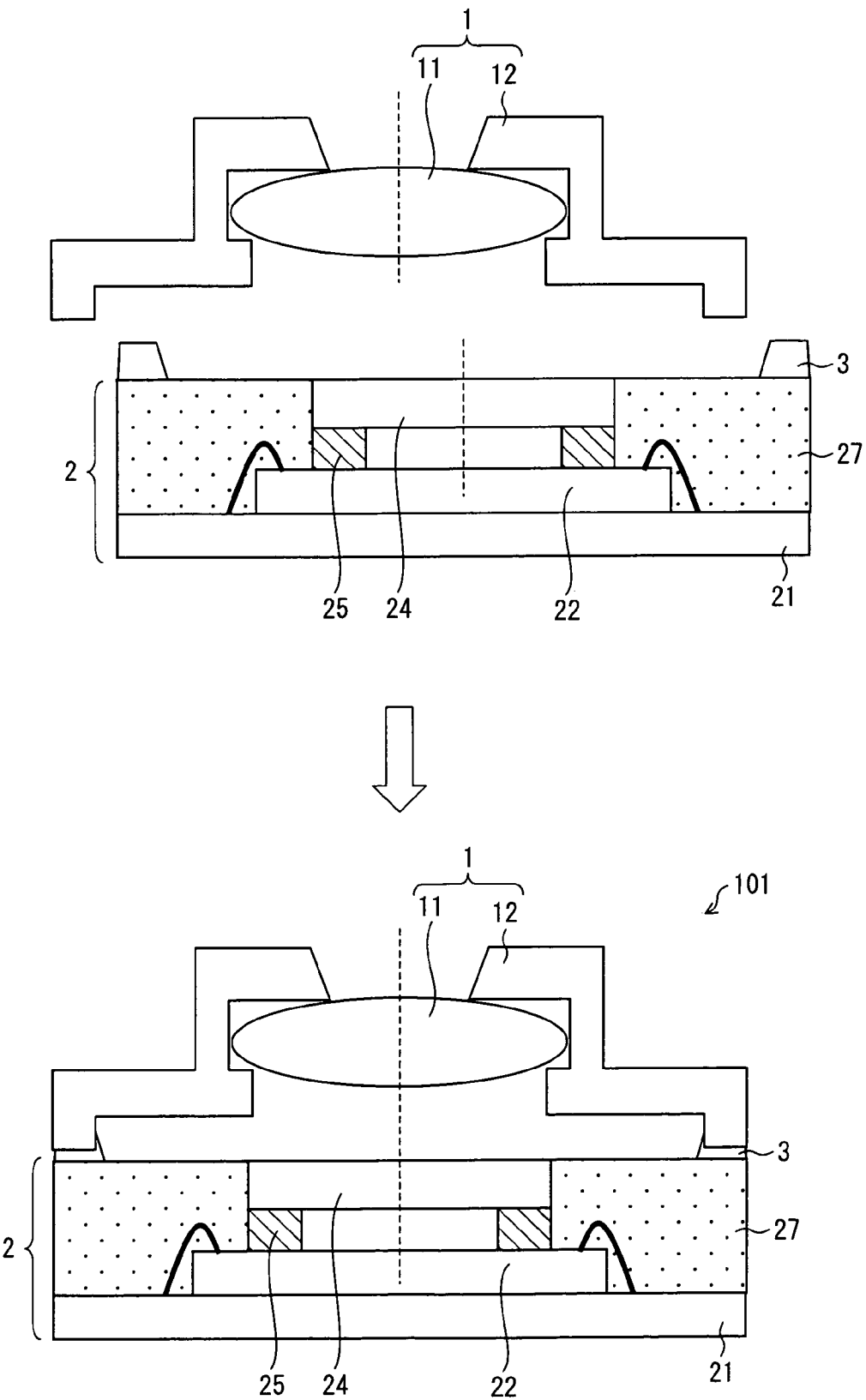
FIG. 10 is a cross-sectional view illustrating an example of how the lens section and the image pickup section are positioned in the solid-state image pickup apparatus of the present invention.
Figure 11:
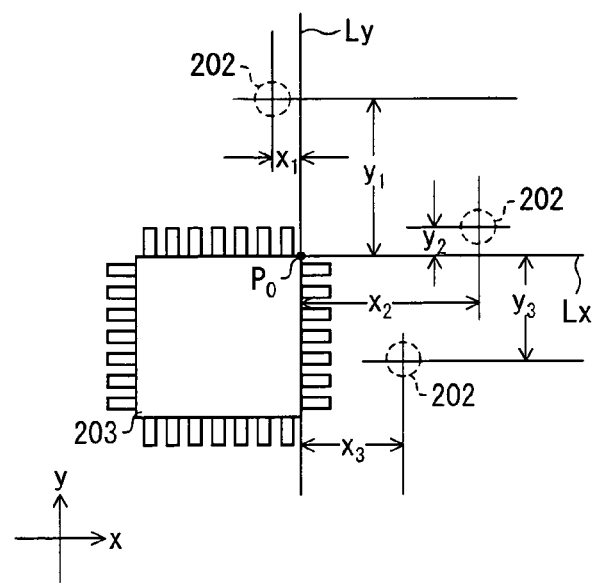
FIG. 11 is a plan view illustrating a method described in Patent Literature 1 for mounting a component on a printed circuit board.
Figure 12:
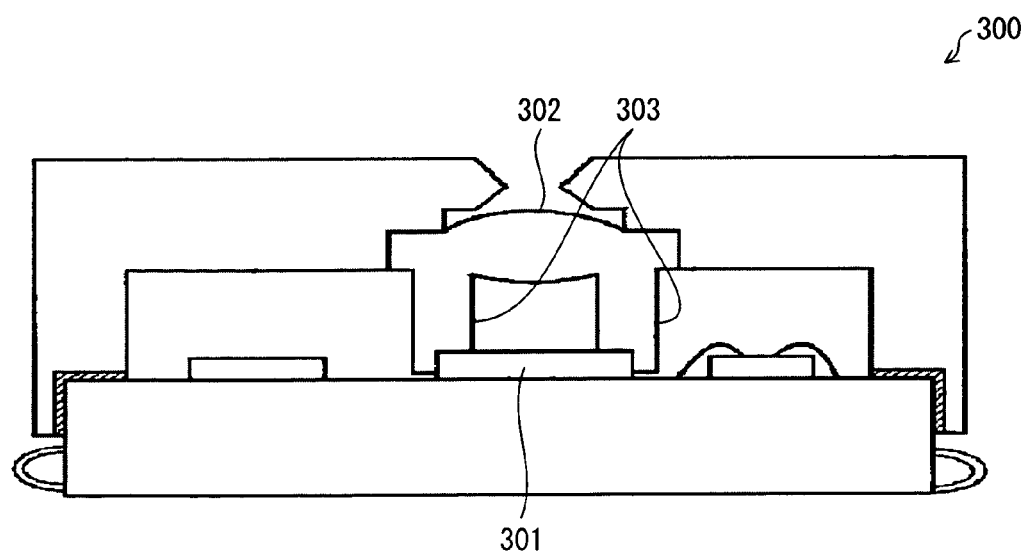
FIG. 12 is a cross-sectional view of a solid-state image pickup apparatus described in Patent Literature 2.
Figure 13:
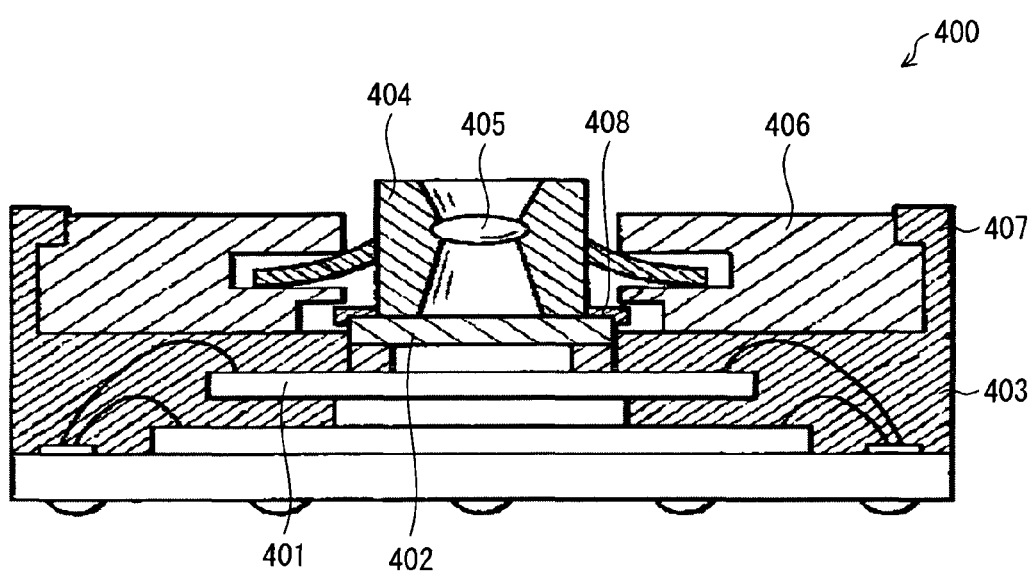
FIG. 13 is a cross-sectional view of a solid-state image pickup apparatus described in Patent Literature 3.

FIG. 10 is a cross-sectional view illustrating a step of producing another solid-state image pickup apparatus 101. The solid-state image pickup apparatus 101 is arranged such that the image pickup section 2 is sealed with a resin. Specifically, the image pickup section 2 is sealed with a resin 27 in such a manner that the resin 27 does not block off an optical path. Namely, the solid-state image pickup apparatus 101 has a so-called CSP (Chip Scale Package) structure in which each of the members on the wiring substrate 21 is sealed with the resin 27.

The solid-state image pickup apparatus 101 is arranged such that a top surface of the transparent cover section 24 is exposed in the resin 27. This allows positioning of the lens section 1 and the image pickup section 2 with high accuracy by the positioning mark 26 with reference to the transparent cover section 24 even if the image pickup section 2 is sealed with a resin. Furthermore, it is possible to cause the solid-state image pickup apparatus 101 to be more shock-resistant since the image pickup section 2 is sealed with a resin.

Note that it is impossible to conventionally cause the wiring substrate to serve as the reference for positioning the lens section and the image pickup section since it is impossible to recognize the wiring substrate when the image pickup section is sealed with a resin (packaged). Therefore, the lens section 1 and the image pickup section 2 are positioned by recognizing an outline (a corner or a contour) of the image pickup section 2 which is sealed with a resin. However, in this case, variations in resin molding, cutoff, or cutting are adversely added to an accuracy in mounting of the lens section 1 on the image pickup section 2. Specifically, in a case where the outline of the image pickup section 2 is the reference for positioning the lens section 1 and the image pickup section 2, an accuracy in the positioning of the transparent cover section 24 on the solid-state image sensing device 22 is ±0.15 mm (±150 μm). Accordingly, causing the transparent cover section 24 to serve as the reference for positioning the lens section 1 and the image pickup section 2 allows the lens section 1 and the image pickup section 2 to be positionally aligned with high accuracy even if the image pickup section 2 is sealed with a resin.

Further, it is possible to provide the positioning mark 26 on the transparent cover section 24 either before or after the transparent cover section 24 is adhered to the solid-state image sensing device 22. However, it is preferable to adhere, to the solid-state image sensing device 22, the transparent cover section 24 on which the positioning mark 26 is provided in advance since this is simple and easy in terms of operation and there is no fear of displacement of the solid-state image sensing device 22.

As described earlier, a solid-state image pickup apparatus of the present invention is arranged such that: a solid-state image sensing device and a transparent cover section are provided so as to be spaced from a lens section; and the transparent cover section is provided with a positioning mark which serves as a reference for positioning the lens section in consideration of an image pickup section. This brings about an effect that it is possible to provide a shock-resistant solid-state image pickup apparatus in which a lens section and an image pickup section are positionally aligned with high accuracy.

The solid-state image pickup apparatus of the present invention may be arranged such that the positioning mark is provided in a corner portion of the transparent cover section.

According to the invention, a corner portion of the transparent cover serves as the reference position for positioning the lens section and the image pickup section. This facilitates recognition of the positioning mark, and it is thus possible to simply and easily position the lens section and the image pickup section.

The solid-state image pickup apparatus of the present invention may be arranged such that: a surface of the transparent cover section which surface faces the solid-state image sensing device is larger in area than the light-receiving section of the solid-state image sensing device; and the positioning mark is provided in a rim of the transparent cover section.

According to the invention, the rim of the transparent cover section serves as the reference position for positioning the lens section and the image pickup section. Furthermore, the surface of the transparent cover section which surface faces the solid-state image sensing device is larger than a light receiving surface of the solid-state image sensing device. This causes the rim of the transparent cover section to be provided outside the light-receiving surface of the solid-state image sensing device. Namely, the positioning mark is provided in an area in which the positioning mark hardly affects image pickup. This allows positioning of the lens section and the image pickup section without causing the positioning mark to affect image pickup.

The solid-state image pickup apparatus of the present invention is preferably arranged such that: an adhering section which adheres the transparent cover section to the solid-state image sensing device is provided around the light-receiving section of the solid-state image sensing device; and the positioning mark is provided right above the adhering section.

According to the invention, the adhering section which adheres the transparent cover section to the solid-state image sensing device is provided around the light-receiving section. Namely, the adhering section is provided outside the light-receiving surface of the solid-state image sensing device. Moreover, the positioning mark is provided right above the adhering section. This causes the positioning mark to be provided in an area in which the positioning mark hardly affects image pickup. This allows positioning of the lens section and the image pickup section without causing the positioning mark to affect image pickup.

The solid-state image pickup apparatus of the present invention may be arranged such that the positioning mark is a reflecting film which is provided on the transparent cover section.

According to the invention, the positioning mark is a reflecting film. This causes a reflecting film to reflect light which is directed toward the reflecting film. This facilitates recognition of the positioning mark, and it is thus possible to easily position the lens section and the image pickup section.

The solid-state image pickup apparatus of the present invention may be arranged such that the positioning mark is a groove which is provided in the transparent cover section.

According to the invention, the positioning mark is a groove. For this reason, how light which is directed toward the transparent cover section is reflected is different between in a part in which a groove is formed and in a plane part in which the groove is not formed. This facilitates recognition of the positioning mark, and it is thus possible to easily position the lens section and the image pickup section.

The solid-state image pickup apparatus of the present invention may be arranged such that: the positioning mark indicates a central part of the light-receiving section of the solid-state image sensing device; and the positioning mark is a light-emitting film which is transparent under external light and which emits light under black light irradiation.

According to the invention, the positioning mark is a light-emitting film which is transparent under external light and which emits light under black light irradiation. Further, such a light-emitting film indicates the central part of the light-receiving section of the solid-state image sensing device. Namely, the positioning mark indicates the pixel center. This allows positioning of the lens section and the image pickup section with higher accuracy.

The solid-state image pickup apparatus of the present invention may be arranged such that the image pickup section is sealed with a resin in such a manner that the resin does not block off an optical path.

According to the invention, the image pickup section is sealed with a resin so that a top surface of the transparent cover section is exposed. This allows positioning of the lens section and the image pickup section with high accuracy even if the image pickup section is sealed with a resin.

Furthermore, the invention allows an increase in shock-resistance since the image pickup section is sealed with a resin.

In order to solve the problems, an electronic device of the present invention includes a solid-state image pickup apparatus as mentioned above. Consequently, it is possible to provide an electronic device in which a lens section and an image pickup section are positionally aligned with high accuracy.

The present invention can be applied to various electronic devices, each including a solid-state image pickup apparatus. Examples of various electronic devices include: a camera-equipped mobile phone, a digital still camera, and a security camera, such as a surveillance camera and an intercom.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the aforementioned detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A solid-state image pickup apparatus comprising:
a lens section which forms a subject image; and
an image pickup section which converts the subject image formed by the lens section, into an electric signal, the image pickup section including:
a wiring substrate;
a solid-state image sensing device which is mounted on the wiring substrate; and
a transparent cover section which is provided (i) so as to face a light-receiving section of the solid-state image sensing device and (ii) so as to have a gap between the solid-state image sensing device and the transparent cover section, the solid-state image sensing device and the transparent cover section each being provided so as to be spaced from the lens section, and the transparent cover section being provided with a positioning mark which serves as a reference for positioning the lens section in consideration of the image pickup section,
the positioning mark indicates a central part of the light-receiving section of the solid-state image sensing device; and
the positioning mark is a light-emitting film which is transparent under external light and which emits light under black light irradiation.

2. The solid-state image pickup apparatus as set forth in claim 1, wherein:
a surface of the transparent cover section which surface faces the solid-state image sensing device is larger in area than the light-receiving section of the solid-state image sensing device.

3. The solid-state image pickup apparatus as set forth in claim 1, wherein:
an adhering section which adheres the transparent cover section to the solid-state image sensing device is provided around the light-receiving section of the solid-state image sensing device.

4. The solid-state image pickup apparatus as set forth in claim 1, wherein the positioning mark is a reflecting film which is provided on the transparent cover section.

5. The solid-state image pickup apparatus as set forth in claim 1, wherein the image pickup section is sealed with a resin in such a manner that the resin does not block off an optical path.

6. An electronic device comprising a solid-state image pickup apparatus, the solid-state image pickup apparatus including:
a lens section which forms a subject image; and
an image pickup section which converts the subject image formed by the lens section, into an electric signal, the image pickup section including:
a wiring substrate;
a solid-state image sensing device which is mounted on the wiring substrate; and a transparent cover section which is provided (i) so as to face a light-receiving section of the solid-state image sensing device and (ii) so as to have a gap between the solid-state image sensing device and the transparent cover section, the solid-state image sensing device and the transparent cover section, each being provided so as to be spaced from the lens section, and the transparent cover section being provided with a positioning mark which serves as a reference for positioning the lens section in consideration of the image pickup section, the positioning mark indicates a central part of the light-receiving section of the solid-state image sensing device; and the positioning mark is a light-emitting film which is transparent under external light and which emits light under black light irradiation.

7. The electronic device as set forth in claim 6, wherein a surface of the transparent cover section which surface faces the solid-state image sensing device is larger in area than the light-receiving section of the solid-state image sensing device.

8. The electronic device as set forth in claim 6, further comprising an adhering section around the light-receiving section of the solid-state image sensing device for securing the transparent cover section to the solid-state image sensing device.

9. The electronic device as set forth in claim 6, wherein the transparent cover section is made from transparent glass or resin, and includes an optical filter coating on the transparent glass or resin.

10. A solid-state image pickup apparatus as recited in claim 3, wherein the adhering section forms a ventilation hole in fluid communication with the gap.

\* \* \* \* \*